United States Patent
Guo et al.

(10) Patent No.: US 11,563,033 B2
(45) Date of Patent: Jan. 24, 2023

(54) FLEXIBLE ARRAY SUBSTRATE, MANUFACTURING METHOD THEREOF, FLEXIBLE DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuanzheng Guo, Beijing (CN); Tao Gao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 173 days.

(21) Appl. No.: 16/905,105

(22) Filed: Jun. 18, 2020

(65) Prior Publication Data
US 2021/0013242 A1  Jan. 14, 2021

(30) Foreign Application Priority Data
Jul. 9, 2019  (CN) .......................... 201910614308.8

(51) Int. Cl.
*H01L 27/12* (2006.01)
*H01L 27/32* (2006.01)
*H01L 51/00* (2006.01)

(52) U.S. Cl.
CPC ...... *H01L 27/1218* (2013.01); *H01L 27/1244* (2013.01); *H01L 27/3279* (2013.01); *H01L 51/0097* (2013.01); *H01L 27/1259* (2013.01)

(58) Field of Classification Search
CPC ............. H01L 27/1244; H01L 27/1218; H01L 27/3279; H01L 51/0097; H01L 2251/5338
See application file for complete search history.

(56) References Cited

U.S. PATENT DOCUMENTS

| 2003/0127652 A1 | 7/2003 | Park et al. |
| 2012/0138940 A1* | 6/2012 | Sato ..................... H01L 27/1218 257/59 |

(Continued)

FOREIGN PATENT DOCUMENTS

| CN | 107579090 A | 1/2018 |
| CN | 107871757 A | 4/2018 |

OTHER PUBLICATIONS

"First Office Action and English language translation", CN Application No. 201910614308.8, dated Nov. 9, 2020, 12 pp.

*Primary Examiner* — Peter M Albrecht
(74) *Attorney, Agent, or Firm* — Myers Bigel, P.A.

(57) ABSTRACT

Embodiments of the present disclosure provide a flexible array substrate, a manufacturing method thereof, and a flexible display device, which relate to the field of display technology, and can reduce the difficulty of wiring, decrease the IR drop, and improve the problem that the wiring is prone to breakage when bent. The flexible array substrate includes a substrate, the substrate including a first sub-substrate and a second sub-substrate which are stacked, the second sub-substrate including at least one via hole; a wiring layer disposed between the first sub-substrate and the second sub-substrate; and a pixel array layer disposed on a side of the second sub-substrate facing away from the first sub-substrate; the wiring layer including a wiring, wherein the pixel array layer is electrically connected to the wiring through the at least one via hole.

12 Claims, 3 Drawing Sheets

(56) References Cited

U.S. PATENT DOCUMENTS

| | | | |
|---|---|---|---|
| 2017/0125505 A1* | 5/2017 | Oh | H01L 27/3276 |
| 2018/0012939 A1 | 1/2018 | Lin et al. | |
| 2018/0145124 A1* | 5/2018 | Kim | H01L 27/3276 |
| 2019/0013339 A1 | 1/2019 | Li et al. | |

* cited by examiner

FLEXIBLE ARRAY SUBSTRATE, MANUFACTURING METHOD THEREOF, FLEXIBLE DISPLAY DEVICE

RELATED APPLICATION

The present application claims the benefit of Chinese Patent Application No. 201910614308.8, filed on Jul. 9, 2019, the entire disclosure of which is incorporated herein by reference.

TECHNICAL FIELD

The present disclosure relates to the field of display technology, especially to a flexible array substrate, a manufacturing method thereof, and a flexible display device.

BACKGROUND

In recent years, with the continuous development of display technology, users have increasingly higher requirements on the resolution of display devices. However, as the resolution increases, the difficulty of wiring is getting bigger and bigger.

SUMMARY

Embodiments of the present disclosure provide a flexible array substrate, a manufacturing method thereof, and a flexible display device, which can reduce the difficulty of wiring, decrease the IR drop, and improve the problem that the wiring is prone to breakage when bent.

In a first aspect, there is provided a flexible array substrate, comprising: a substrate, the substrate comprising a first sub-substrate and a second sub-substrate which are stacked; the second sub-substrate comprising at least one via hole; a wiring layer disposed between the first sub-substrate and the second sub-substrate; and a pixel array layer disposed on a side of the second sub-substrate facing away from the first sub-substrate; the wiring layer comprising a wiring, the wiring comprises a gate line and a data line that are insulated from each other, wherein the pixel array layer is electrically connected to the wiring through the at least one via hole. The flexible array substrate comprises a main display region, a bending region, and a driving circuit region; the pixel array layer extends from the main display region to the driving circuit region; the driving circuit region comprises a driving circuit; and in the driving circuit region, the driving circuit is electrically connected to the wiring through the pixel array layer.

Optionally, the pixel array layer comprises a thin film transistor; the thin film transistor comprises a gate and a source; the gate is electrically connected to the gate line through a first via hole of the at least one via hole, and the source is electrically connected to the data line through a second via hole of the at least one via hole.

Optionally, the second sub-substrate comprises at least one flexible substrate.

Optionally, a material of the at least one flexible substrate comprises polyimide (PI).

Optionally, the second sub-substrate further comprises at least one spacer layer; the at least one flexible substrate and the at least one spacer layer are stacked alternately; and one of the at least one spacer layer is in direct contact with the pixel array layer.

Optionally, a material of the at least one spacer layer comprises an inorganic insulating material.

In a second aspect, there is provided a flexible display device comprising the flexible array substrate described in any one of the foregoing embodiments.

In a third aspect, there is provided a manufacturing method of a flexible array substrate, comprising: providing a first sub-substrate and a wiring layer which are stacked, the wiring layer comprising a wiring; forming a second sub-substrate on a side of the wiring layer facing away from the first sub-substrate, forming at least one via hole on the second sub-substrate; and forming a pixel array layer on a side of the second sub-substrate facing away from the first sub-substrate, the pixel array layer being electrically connected to the wiring through the at least one via hole.

Optionally, forming a pixel array layer on a side of the second sub-substrate facing away from the first sub-substrate comprises: forming a thin film transistor; the thin film transistor comprises a gate and a source, the wiring comprises a gate line and a data line that are insulated from each other; the gate is electrically connected to the gate line through a first via hole of the at least one via hole, and the source is electrically connected to the data line through a second via hole of the at least one via hole.

Optionally, the flexible array substrate comprises a main display region, a bending region, and a driving circuit region; the pixel array layer extends from the main display region to the driving circuit region; the driving circuit region comprises a driving circuit; and in the driving circuit region, the driving circuit is electrically connected to the wiring through the pixel array layer.

Optionally, forming a second sub-substrate on a side of the wiring layer facing away from the first sub-substrate comprises: forming at least one flexible substrate and at least one spacer layer on a side of the wiring layer facing away from the first sub-substrate; the at least one flexible substrate and the at least one spacer layer being stacked alternately. One of the at least one spacer layer is in direct contact with the pixel array layer.

Optionally, forming at least one flexible substrate and at least one spacer layer on a side of the wiring layer facing away from the first sub-substrate comprises: forming at least one flexible insulating film and at least one inorganic insulating film on a side of the wiring layer facing away from the first sub-substrate, the at least one flexible insulating film and the at least one inorganic insulating film being stacked alternately.

Optionally, forming at least one via hole on the second sub-substrate comprises: performing a patterning process on the at least one flexible insulating film and the at least one inorganic insulating film, thereby forming the at least one via hole.

BRIEF DESCRIPTION OF THE DRAWINGS

In order to more clearly illustrate embodiments of the present disclosure or technical solutions in the prior art, the drawings to be used for description of the embodiments or the prior art will be briefly introduced below. Obviously, the drawings described below are only some embodiments of the present disclosure. A person having an ordinary skill in the art may also obtain other drawings based on these drawings without spending inventive efforts.

DETAILED DESCRIPTION OF THE DISCLOSURE

The technical solutions in embodiments of the present disclosure will be described clearly and comprehensively below in conjunction with the drawings in the embodiments of the present disclosure. Obviously, the described embodiments are only part of the embodiments of the present disclosure, rather than all of them. All other embodiments obtained by a person having an ordinary skill in the art based on the embodiments of the present disclosure without spending inventive efforts fall within the protection scope of the present disclosure.

A flexible display device may be used as a mobile phone, a tablet computer, a personal digital assistant (PDA), an in-vehicle computer, etc. The specific use of the flexible display device is not particularly limited in embodiments of the present disclosure.

Figure 1:
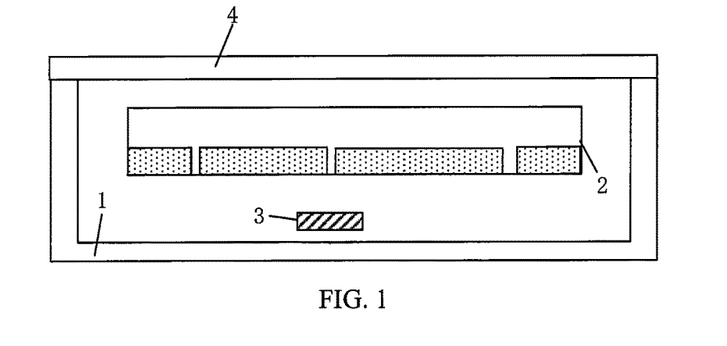
FIG. 1 is a schematic structural view of a flexible display device provided by an embodiment of the present disclosure.

As shown in FIG. 1, the flexible display device may comprise, for example, a frame 1, a flexible display panel 2, a circuit board 3, a cover plate 4, and other electronic accessories including a camera and the like.

Taking the light exit direction of the flexible display panel 2 being top emission as an example, the frame 1 may be a U-shaped frame, and the flexible display panel 2 and the circuit board 3 are disposed in the frame 1. The cover plate 4 is disposed on the light exit side of the flexible display panel 2, and the circuit board 3 is disposed on a side of the display panel 2 facing away from the cover plate 4.

The flexible display panel 2 may be, for example, an OLED display panel, a micro-light emitting diode (Micro-LED) display panel, or a quantum dot light emitting diode (QLED) display panel.

The above flexible display panel 2 comprises a flexible array substrate.

An embodiment of the present disclosure provides a flexible array substrate that can be used as a flexible array substrate in the flexible display panel 2 described above. Of course, the flexible array substrate may also be used for other flexible display panels, which is not particularly limited in embodiments of the present disclosure.

Figure 2:
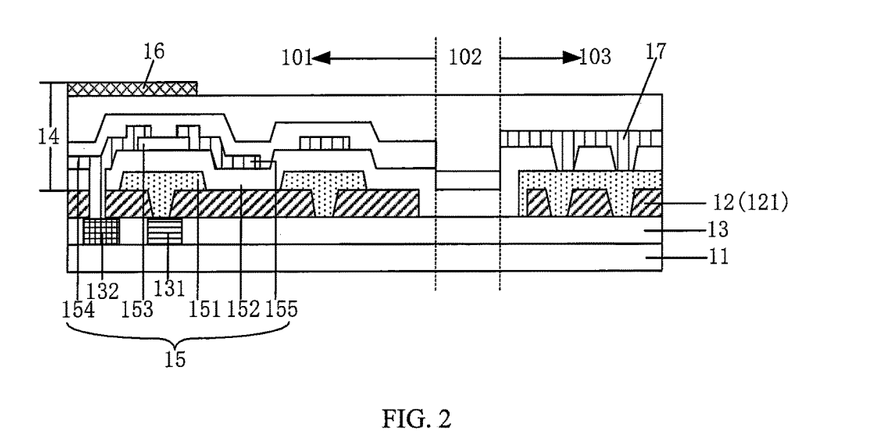
FIG. 2 is a schematic structural view of a flexible array substrate provided by an embodiment of the present disclosure.

As shown in FIG. 2, the flexible array substrate comprises a substrate, the substrate comprising a first sub-substrate 11 and a second sub-substrate 12 which are stacked, the second sub-substrate 12 comprising at least one via hole. The flexible array substrate further comprises a wiring layer 13 disposed between the first sub-substrate 11 and the second sub-substrate 12, and a pixel array layer 14 disposed on a side of the second sub-substrate 12 facing away from the first sub-substrate 11; the wiring layer 13 comprising a wiring; and the pixel array layer 14 being electrically connected to the wiring through the at least one via hole.

In some embodiments, those skilled in the art should be aware that the substrate of the flexible array substrate may include a flexible material, that is, a material that can be bent or folded.

In some embodiments, the first sub-substrate 11 and the second sub-substrate 12 may comprise one insulating layer, and may also comprise multiple insulating layers. The material of the insulating layer may be a flexible material, for example, polyimide (PI); or the material of the insulating layer may also be an inorganic material, such as silicon oxide, silicon nitride, etc.; or the multiple insulating layers may also comprise a composite film layer composed of a flexible material and an inorganic material.

In some embodiments, the wiring layer 13 comprises multiple wirings, and the multiple wirings may be insulated from each other or electrically connected to each other as needed, which is not particularly limited in embodiments of the present disclosure.

In some embodiments, the flexible array substrate comprises a plurality of sub-pixels arranged in an array. The pixel array layer 14 in the flexible array substrate comprises functional structures for constituting sub-pixels.

For example, the pixel array layer 14 comprises a pixel circuit and a light emitting device.

The pixel circuit comprises a thin film transistor 15, a capacitor, and the like. The thin film transistor 15 may be a bottom gate type, a top gate type, a double gate type, or the like.

Taking the flexible array substrate being applied to an OLED display panel as an example, the light emitting device comprises an anode 16, an organic light emitting functional layer, and a cathode.

Taking the flexible array substrate being applied to a QLED display panel as an example, the light emitting device comprises an anode 16, a quantum dot light emitting functional layer, and a cathode.

Taking the flexible array substrate being applied to a Micro-LED display panel as an example, the light emitting device comprises a first operating voltage (VDD) layer, a second operating voltage (VSS) layer, and an LED light emitting unit.

In some embodiments, at least part of the conductive structures in the pixel array layer 14 may be electrically connected to the wirings in the wiring layer 13.

For example, the thin film transistor 15 comprises a gate 151, a source 154, and a drain 155. The wiring layer 13 comprises a data line 132 and a gate line 131. The gate 151 of the thin film transistor 15 is electrically connected to the gate line 131, and the source 154 of the thin film transistor 15 is electrically connected to the data line 132.

On this basis, the thin film transistor 15 further comprises a gate insulating layer 152, an active layer 153, and the like.

An embodiment of the present disclosure provides a flexible array substrate. A wiring layer 13 is provided separately, and the wiring layer 13 is fabricated between the first sub-substrate 11 and the second sub-substrate 12. On the one hand, the difficulty of wiring can be reduced compared with the prior art. At the same time, since the wirings in the embodiment of the present disclosure are fabricated separately in a single layer, the line width and the line spacing of the wirings may be larger than those in the prior art respectively, which can not only reduce the resistance of the wiring due to the increase in the line width so as to decrease the IR drop (voltage drop), but also improve the yield of the lithography process. On the other hand, since the substrate includes a flexible material and the wiring layer 13 is between the first sub-substrate 11 and the second sub-substrate 12, a flexible film layer is formed above and/or below the wiring layer 13. When the flexible array substrate is being bent, the problem that the wiring of the wiring layer 13 is prone to breakage can be improved.

Optionally, as shown in FIG. 2, the flexible array substrate comprises a main display region 101, a bending region 102, and a driving circuit region 103. The pixel array layer 14 extends from the main display region 101 to the driving circuit region 103. The driving circuit region 103 comprises a driving circuit 17. In the driving circuit region 103, the driving circuit 17 is electrically connected to the wiring through the pixel array layer 14.

The portion in the pixel array layer 14 that is located in the bending region 102 includes a plurality of leads for electrically connecting the driving circuit 17 to the portion in the pixel array layer 14 that is located in the main display region 101.

In some embodiments, those skilled in the art should be aware that in the flexible array substrate, the main display region 101, the bending region 102 and the driving circuit region 103 are three consecutive regions. In the case where the flexible array substrate is applied to a flexible display device, the main display region 101 is used to display images, and the bending region 102 is used to bend the driving circuit region 103 to the backlight side of the main display region 101.

In some embodiments, the driving circuit 17 is electrically connected to the wirings through the pixel array layer 14. The pixel array layer 14 comprises a plurality of conductive structures. In order to avoid short circuiting of the plurality of conductive structures in the pixel array layer 14, the driving circuit 17 may be electrically connected to the wirings through part of the conductive structures in the pixel array layer 14.

Of course, in other embodiments, the driving circuit 17 may also be arranged in the same layer as part of the conductive structures in the pixel array layer 14 and formed by the same patterning process to simplify the manufacturing process for the flexible array substrate.

Those skilled in the art should be aware that the portion in the pixel array layer 14 that is located in the main display region 101 extends to the driving circuit region 103 through the leads of the bending region 102, and is electrically connected to the driving circuit 17.

However, the leads in the pixel array layer 14 that is located in the bending region 102 are prone to breakage, which further affects the display effect.

On this basis, in an embodiment of the present disclosure, in the driving circuit region 103, the driving circuit 17 is electrically connected to the wiring through the pixel array layer 14. In this way, even if the wiring in the pixel array layer 14 that is located in the bending region 102 is broken, the driving circuit 17 can also be electrically connected to the wiring through the portion in the pixel array layer 14 that is located in the driving circuit region 103, thereby preventing display from being affected.

Optionally, as shown in FIG. 2, the second sub-substrate 12 comprises a flexible substrate 121. The material of the flexible substrate 121 and/or the first sub-substrate 11 includes PI.

In the related art, the bending region 102 is usually filled with photosensitive polyimide (PSPI), and the elongation at break of the material is just 4%. Multiple bends can easily cause the material to break, and further result in breakage of the conductive structures, wirings, etc. located above it, which affects the reliability of the product.

In an embodiment of the present disclosure, a substrate including PI is provided above and/or below the wiring layer 13, and the elongation at break can reach 30%, which greatly improves the reliability of the product and increases the service life of the product.

Figure 3:
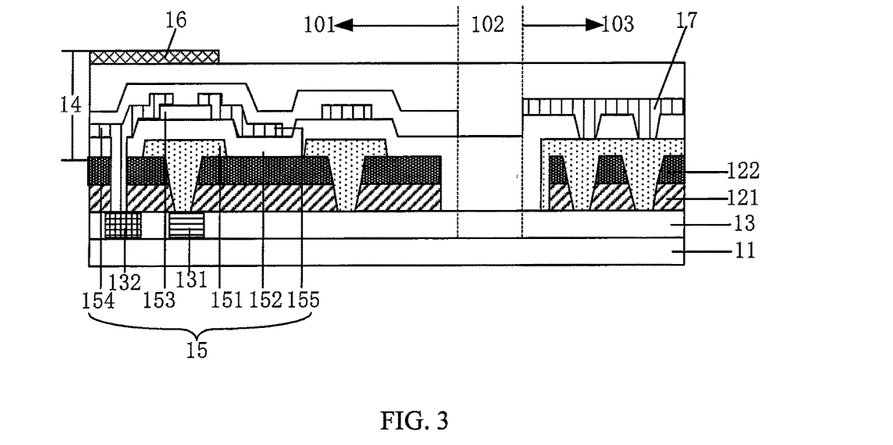
FIG. 3 is a schematic structural view of a flexible array substrate provided by an embodiment of the present disclosure.

Optionally, as shown in FIG. 3, the second sub-substrate 12 further comprises a spacer layer 122. The flexible substrate 121 and the spacer layer 122 are stacked alternately along a thickness direction of the substrate. The spacer layer 122 in the second sub-substrate 12 close to the pixel array layer 14 is in direct contact with the pixel array layer 14.

The material of the spacer layer 122 is an inorganic insulating material.

Figure 9:
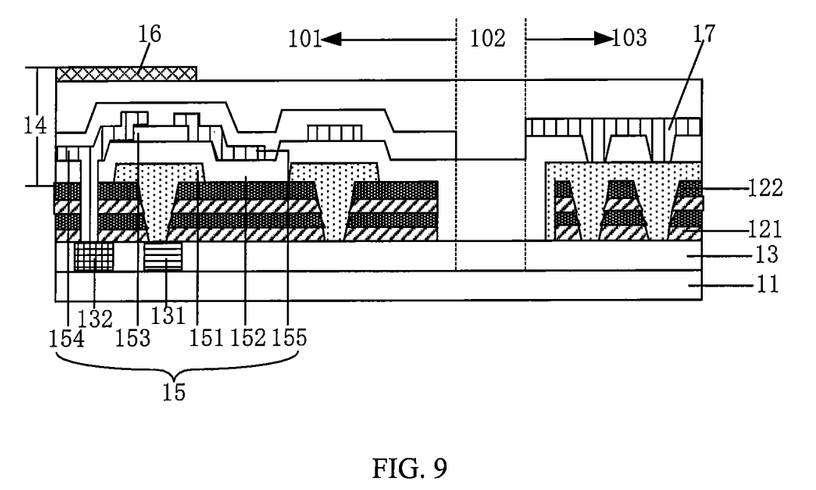
FIG. 9 is a schematic structural view of a flexible array substrate provided by an embodiment of the present disclosure.

In some embodiments, as shown in FIG. 9, the second sub-substrate 12 comprises at least one flexible substrate 121 and at least one spacer layer 122. The at least one flexible substrate 121 and the at least one spacer layer 122 are stacked alternately. One of the at least one spacer layer 122 is in direct contact with the pixel array layer 14.

In an embodiment of the present disclosure, the substrate further comprises a spacer layer 122. On the one hand, the stability of the flexible array substrate can be improved, and on the other hand, the surface of the spacer layer 122 made of an inorganic material is usually relatively flat, which can thus ensure good characteristics of the pixel array layer 14 formed on the substrate.

Figure 4:
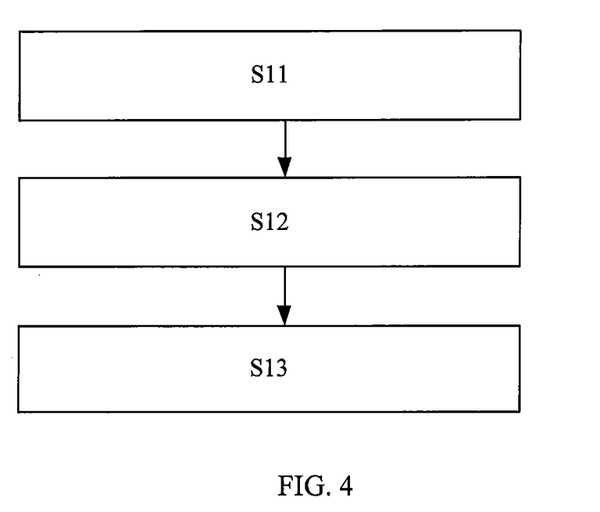
FIG. 4 is a flow chart of manufacturing a flexible array substrate provided by an embodiment of the present disclosure.

An embodiment of the present disclosure further provides a manufacturing method of a flexible array substrate, as shown in FIG. 4, which can be implemented by the following steps.

Figure 5:
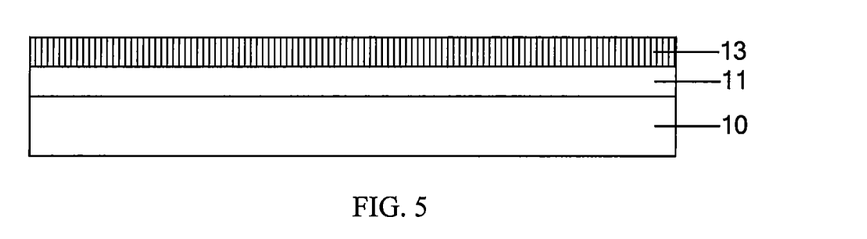
FIG. 5 is a schematic view illustrating a process of manufacturing a flexible array substrate provided by an embodiment of the present disclosure.

S11, providing a first sub-substrate and a wiring layer which are stacked, the wiring layer including a wiring. As shown in FIG. 5, a first sub-substrate 11 and a wiring layer 13 are formed on a rigid substrate 10 successively, and the wiring layer 13 includes a wiring.

In some embodiments, those skilled in the art should be aware that the substrate of the flexible array substrate may include a flexible material. In addition, the first sub-substrate 11 and the wiring layer 13 may also be formed on a flexible substrate (for example, but not limited to, a release layer).

In some embodiments, the first sub-substrate 11 may comprise one insulating layer, and may also comprise multiple insulating layers. The material of the insulating layer may be a flexible material, such as PI; or the material of the insulating layer may also be an inorganic material, such as silicon oxide, silicon nitride, etc.; or the multiple insulating layers may also comprise a composite film layer composed of a flexible material and an inorganic material.

In some embodiments, the thickness of the first sub-substrate 11 is not limited, and it depends on actual requirements.

Taking the first sub-substrate 11 being one layer as an example, the thickness of the first sub-substrate 11 may range from 5 to 20 μm.

In some embodiments, the wiring layer 13 includes multiple wirings, and the multiple wirings may be insulated from each other or electrically connected to each other as needed, which is not particularly limited in embodiments of the present disclosure.

Figure 6:
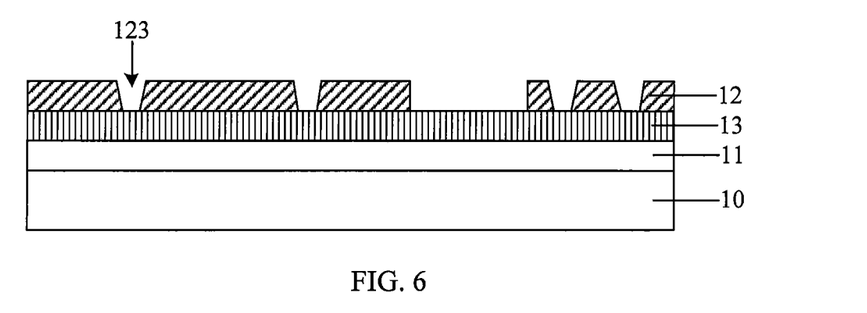
FIG. 6 is a schematic view illustrating a process of manufacturing a flexible array substrate provided by an embodiment of the present disclosure.

S12, forming a second sub-substrate on a side of the wiring layer facing away from the first sub-substrate, and forming at least one via hole on the second sub-substrate. As shown in FIG. 6, a second sub-substrate 12 is formed on a side of the wiring layer 13 facing away from the first sub-substrate 11, and at least one via hole 123 is formed on the second sub-substrate 12.

In some embodiments, the second sub-substrate 12 may comprise one insulating layer, and may also comprise multiple insulating layers. The material of the insulating layer may be a flexible material, such as PI; or the material of the insulating layer may also be an inorganic material, such as silicon oxide, silicon nitride, etc.; or the multiple insulating layers may also comprise a composite film layer composed of a flexible material and an inorganic material.

In some embodiments, the thickness of the second sub-substrate 12 is not limited, and it depends on actual requirements.

Taking the second sub-substrate 12 being one layer as an example, the thickness of the second sub-substrate 12 may range from 1 to 10 μm.

S13, forming a pixel array layer on a side of the second sub-substrate facing away from the first sub-substrate, the pixel array layer being electrically connected to the wiring through the at least one via hole. As shown in FIGS. 2 and 3, a pixel array layer 14 is formed on a side of the second sub-substrate 12 facing away from the first sub-substrate 11, and the pixel array layer 14 is electrically connected to the wiring through the at least one via hole 123.

In some embodiments, the flexible array substrate comprises a plurality of sub-pixels arranged in an array. The pixel array layer 14 in the flexible array substrate comprises functional structures for constituting sub-pixels.

For example, the pixel array layer 14 comprises a pixel circuit and a light emitting device.

The pixel circuit comprises a thin film transistor 15, a capacitor, and the like. The thin film transistor 15 may be a bottom gate type, a top gate type, a double gate type, or the like.

Taking the flexible array substrate being applied to an OLED display panel as an example, the light emitting device comprises an anode 16, an organic light emitting functional layer, and a cathode.

Taking the flexible array substrate being applied to a QLED display panel as an example, the light emitting device comprises an anode, a quantum dot light emitting functional layer, and a cathode.

Taking the flexible array substrate being applied to a Micro-LED display panel as an example, the light emitting device comprises a first operating voltage (VDD) layer, a second operating voltage (VSS) layer, and an LED light emitting unit.

In some embodiments, at least part of the conductive structures in the pixel array layer 14 may be electrically connected to the wirings in the wiring layer 13.

Optionally, forming a pixel array layer on a side of the second sub-substrate facing away from the first sub-substrate comprises: forming a thin film transistor. The thin film transistor comprises a gate and a source, and the wiring comprises a gate line and a data line insulated from each other. The gate is electrically connected to the gate line through a first via hole of the at least one via hole, and the source is electrically connected to the data line through a second via hole of the at least one via hole.

For example, as shown in FIG. 2 or FIG. 3, the thin film transistor 15 comprises a gate 151, a source 154, and a drain 155, and the wiring layer 13 comprises a data line 132 and a gate line 131. The gate 151 of the thin film transistor 15 is electrically connected to the gate line 131, and the source 154 of the thin film transistor 15 is electrically connected to the data line 132.

On this basis, the thin film transistor 15 further comprises a gate insulating layer 152, an active layer 153, and the like.

In some embodiments, the anode of the OLED display panel or the QLED display panel, or the first operating voltage layer of the Micro-LED display panel may also be electrically connected to the wiring of the wiring layer 13.

An embodiment of the present disclosure provides a manufacturing method of a flexible array substrate. A wiring layer 13 is provided separately, and the wiring layer 13 is fabricated between the first sub-substrate 11 and the second sub-substrate 12. On the one hand, the difficulty of wiring can be reduced compared with the prior art. At the same time, since the wirings in the embodiment of the present disclosure are fabricated separately in a single layer, the line width and the line spacing of the wirings may be larger than those in the prior art respectively, which can not only reduce the resistance of the wiring due to the increase in the line width so as to decrease the IR drop, but also improve the yield of the lithography process. On the other hand, since the substrate includes a flexible material and the wiring layer 13 is between the first sub-substrate 11 and the second sub-substrate 12, a flexible film layer is formed above and/or below the wiring layer 13. When the flexible array substrate is being bent, the problem that the wiring of the wiring layer 13 is prone to breakage can be improved.

Optionally, as shown in FIG. 2, the flexible array substrate comprises a main display region 101, a bending region 102, and a driving circuit region 103. The pixel array layer 14 extends from the main display region 101 to the driving circuit region 103. The driving circuit region 103 comprises a driving circuit 17. In the driving circuit region 103, the driving circuit 17 is electrically connected to the wiring through the pixel array layer 14.

The portion in the pixel array layer 14 that is located in the bending region 102 includes a plurality of leads for electrically connecting the driving circuit 17 to the portion in the pixel array layer 14 that is located in the main display region 101.

In some embodiments, those skilled in the art should be aware that in the flexible array substrate, the main display region 101, the bending region 102 and the driving circuit region 103 are three consecutive regions. In the case where the flexible array substrate is applied to a flexible display device, the main display region 101 is used to display images, and the bending region 102 is used to bend the driving circuit region 103 to the backlight side of the main display region 101.

In some embodiments, the driving circuit 17 is electrically connected to the wiring through the pixel array layer 14. The pixel array layer 14 comprises a plurality of conductive structures. In order to avoid short circuiting of the plurality of conductive structures in the pixel array layer 14, the driving circuit 17 may be electrically connected to the wiring through part of the conductive structures in the pixel array layer 14.

Of course, in other embodiments, the driving circuit 17 may also be arranged in the same layer as part of the conductive structures in the pixel array layer 14 and formed by the same patterning process to simplify the manufacturing process for the flexible array substrate.

Those skilled in the art should be aware that the portion in the pixel array layer 14 that is located in the main display region 101 extends to the driving circuit region 103 through the leads of the bending region 102, and is electrically connected to the driving circuit 17. However, the leads in the pixel array layer 14 that are located in the bending region 102 are prone to breakage, which further affects the display effect.

On this basis, in an embodiment of the present disclosure, in the driving circuit region 103, the driving circuit 17 is electrically connected to the wiring through the pixel array layer 14. In this way, even if the wiring in the pixel array layer 14 that is located in the bending region 102 is broken, the driving circuit 17 can also be electrically connected to the wiring through the portion in the pixel array layer 14 that is located in the driving circuit region 103, thereby preventing display from being affected.

Optionally, forming a second sub-substrate on a side of the wiring layer facing away from the first sub-substrate comprises: forming at least one flexible substrate 121 and at least one spacer layer 122 on a side of the wiring layer 13 facing away from the first sub-substrate 11. The at least one flexible substrate 121 and the at least one spacer layer 122 are stacked alternately, and one of the at least one spacer layer 122 is in direct contact with the pixel array layer 14.

Figure 7:
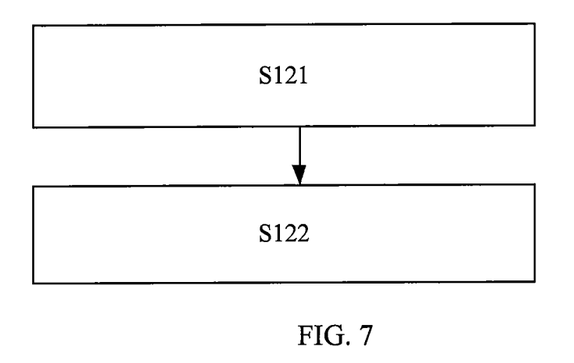
FIG. 7 is a flow chart of manufacturing a second sub-substrate provided by an embodiment of the present disclosure.

Optionally, as shown in FIG. 7, forming the second sub-substrate 12 may further comprise the following steps.

Figure 8:
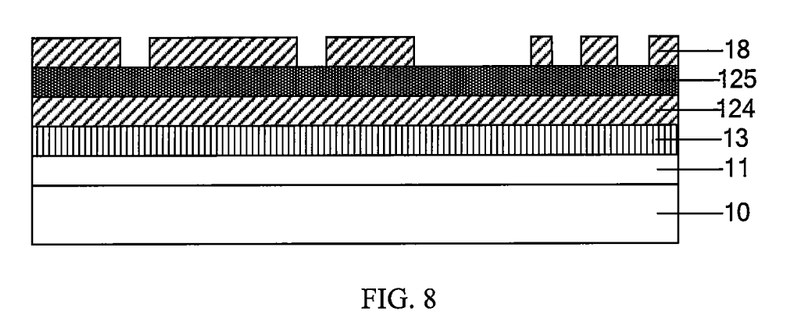
FIG. 8 is a schematic view illustrating a process of manufacturing a second sub-substrate provided by an embodiment of the present disclosure.

S121, forming at least one flexible insulating film and at least one inorganic insulating film on a side of the wiring layer facing away from the first sub-substrate, the at least one flexible insulating film and the at least one inorganic insulating film being stacked alternately. As shown in FIG. 8, a flexible insulating film 124 and an inorganic insulating film 125 alternately stacked are formed on a side of the wiring layer 13 facing away from a rigid substrate 10, and a photoresist pattern 18 is formed on a surface of the inorganic insulating film 125 facing away from the rigid substrate 10. The material of the flexible insulating film 124 and/or the first sub-substrate 11 includes PI.

In some embodiments, the flexible insulating film 124 may comprise one or more layers, and the inorganic insulating film 125 may comprise one or more layers, as long as the layer in the second sub-substrate 12 farthest from the rigid substrate 10 is the inorganic insulating film 125.

S122, performing a patterning process on the at least one flexible insulating film and the at least one inorganic insulating film to form the at least one via hole. As shown in FIG. 3, a patterning process (for example, but not limited to etching, photolithography) is performed on the inorganic insulating film 125 and the flexible insulating film 124 to form the second sub-substrate 12 comprising the flexible substrate 121 and the spacer layer 122.

In an embodiment of the present disclosure, the substrate further comprises a spacer layer 122. On the one hand, the stability of the flexible array substrate can be improved, and on the other hand, the surface of the spacer layer 122 made of an inorganic material is usually relatively flat, which can thus ensure good characteristics of the pixel array layer 14 formed on the substrate. Furthermore, a substrate including PI is provided above and/or below the wiring layer 13, and the elongation at break can reach 30%, which greatly improves the reliability of the product and increases the service life of the product.

What have been stated above are only specific embodiments of the present disclosure, but the protection scope of the present disclosure is not limited thereto. Any variations or substitutions that can be easily conceived by those skilled in the art familiar with this technical field within the technical scope revealed by the present disclosure should be encompassed within the protection scope of the present disclosure. Thus, the protection scope of the present disclosure should be based on the protection scope of the claims.

What is claimed is:

1. A flexible array substrate, comprising:
   a substrate comprising a first sub-substrate and a second sub-substrate which are stacked, wherein the second sub-substrate comprises at least one via hole;
   a wiring layer between the first sub-substrate and the second sub-substrate; and
   a pixel array layer on a side of the second sub-substrate facing away from the first sub-substrate,
   wherein the wiring layer comprises a wiring, the wiring comprises a gate line and a data line that are insulated from each other,
   wherein the pixel array layer is electrically connected to the wiring through the at least one via hole,
   wherein the flexible array substrate comprises a main display region, a bending region, and a driving circuit region,
   wherein the pixel array layer extends from the main display region to the driving circuit region,
   wherein the driving circuit region comprises a driving circuit, and
   wherein in the driving circuit region, the driving circuit is electrically connected to the wiring through the pixel array layer.

2. The flexible array substrate according to claim 1,
   wherein the pixel array layer comprises a thin film transistor,
   wherein the thin film transistor comprises a gate and a source,
   wherein the gate is electrically connected to the gate line through a first via hole of the at least one via hole, and
   wherein the source is electrically connected to the data line through a second via hole of the at least one via hole.

3. The flexible array substrate according to claim 1, wherein the second sub-substrate comprises at least one flexible substrate.

4. The flexible array substrate according to claim 3, wherein a material of the at least one flexible substrate comprises polyimide (PI).

5. The flexible array substrate according to claim 3,
   wherein the second sub-substrate further comprises at least one spacer layer,
   wherein the at least one flexible substrate and the at least one spacer layer are stacked alternately, and
   wherein one of the at least one spacer layer is in direct contact with the pixel array layer.

6. The flexible array substrate according to claim 5, wherein a material of the at least one spacer layer comprises an inorganic insulating material.

7. A flexible display device comprising the flexible array substrate according to claim 1.

8. The flexible display device according to claim 7,
   wherein the pixel array layer comprises a thin film transistor,
   wherein the thin film transistor comprises a gate and a source,
   wherein the gate is electrically connected to the gate line through a first via hole of the at least one via hole, and
   wherein the source is electrically connected to the data line through a second via hole of the at least one via hole.

9. The flexible display device according to claim 7, wherein the second sub-substrate comprises at least one flexible substrate.

10. The flexible display device according to claim 9, wherein a material of the at least one flexible substrate comprises PI.

11. The flexible display device according to claim 9,
wherein the second sub-substrate further comprises at least one spacer layer,
wherein the at least one flexible substrate and the at least one spacer layer are stacked alternately, and
wherein one of the at least one spacer layer is in direct contact with the pixel array layer.

12. The flexible display device according to claim 11, wherein a material of the at least one spacer layer comprises an inorganic insulating material.

\* \* \* \* \*